United States Patent
Sprenger et al.

(10) Patent No.: US 11,068,027 B2
(45) Date of Patent: Jul. 20, 2021

(54) DYNAMIC SCALABLE ATTACHMENT MECHANISM FOR CLIENT DEVICES

(71) Applicant: Intel Corporation, Santa Clara, CA (US)

(72) Inventors: Mark Sprenger, Tigard, OR (US); Jim Okuley, Portland, OR (US); Aleksander Magi, Portland, OR (US)

(73) Assignee: Intel Corporation, Santa Clara, CA (US)

(*) Notice: Subject to any disclaimer, the term of this patent is extended or adjusted under 35 U.S.C. 154(b) by 2 days.

(21) Appl. No.: 16/559,489

(22) Filed: Sep. 3, 2019

(65) Prior Publication Data

US 2019/0391613 A1   Dec. 26, 2019

(51) Int. Cl.
| | | |
|---|---|---|
| *G06F 1/16* | (2006.01) | |
| *H01B 7/04* | (2006.01) | |
| *H05K 5/02* | (2006.01) | |
| *H01F 7/02* | (2006.01) | |

(52) U.S. Cl.
CPC ............ *G06F 1/1632* (2013.01); *H01B 7/04* (2013.01); *H01F 7/0252* (2013.01); *H05K 5/0226* (2013.01); *H05K 5/0247* (2013.01)

(58) Field of Classification Search
CPC .... G06F 1/1632; G06F 1/1656; G06F 1/1681; H01B 7/04; H01B 7/06; H05K 5/0226; H05K 5/0247; H01F 7/0252; H02G 11/006; H01R 13/6205; H01R 11/30
USPC ................................................ 439/38, 39, 40
See application file for complete search history.

(56) References Cited

U.S. PATENT DOCUMENTS

2017/0317444 A1* 11/2017 Narayanasamy ..... H02J 7/0045

\* cited by examiner

*Primary Examiner* — Roshin K Varghese
(74) *Attorney, Agent, or Firm* — Schwabe, Williamson & Wyatt, P.C.

(57) ABSTRACT

A magnetic flexible cable disposed in the housing of a device has an extended position to engage with a corresponding receptacle on another device. The flexible magnetic cable includes a flanged end that limits the distance of extension when the flexible magnetic cable is in the extended position. A retractor can retain the flexible magnetic cable fully within the housing of the first device when the flexible magnetic cable is not engaged with the corresponding receptacle on the second device.

18 Claims, 9 Drawing Sheets

DYNAMIC SCALABLE ATTACHMENT MECHANISM FOR CLIENT DEVICES

BACKGROUND

Currently, end users are unable to modularize (attach or detach) configurations within their client devices to create a customized and cohesive form factor. For example, to connect an ad-hoc hinging module (e.g., for an additional display, battery, SSD, I/O) onto a laptop, a user would need to connect a cable, and/or wirelessly connect to the module, and physically support that module in a brace of some kind. This can result in a reduced speed of interaction and often results in an unsatisfying user experience.

BRIEF DESCRIPTION OF THE DRAWINGS

With respect to the discussion to follow and in particular to the drawings, it is stressed that the particulars shown represent examples for purposes of illustrative discussion and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. Similar or same reference numbers may be used to identify or otherwise refer to similar or same elements in the various drawings and supporting descriptions. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1A:
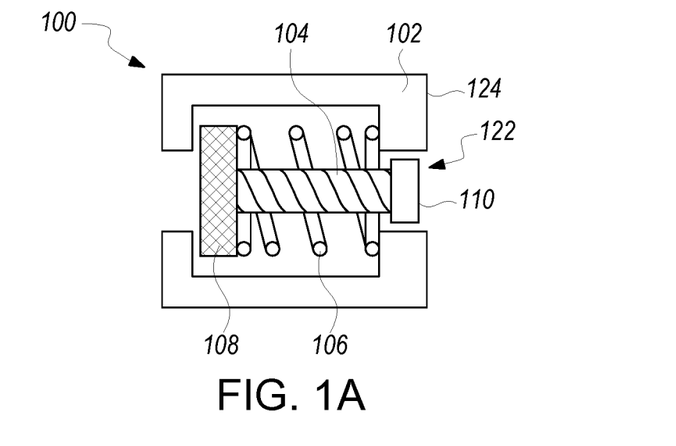
FIGS. 1A, 1B, 1C show aspects of an attachment mechanism in accordance with the present disclosure.
Figure 1B:
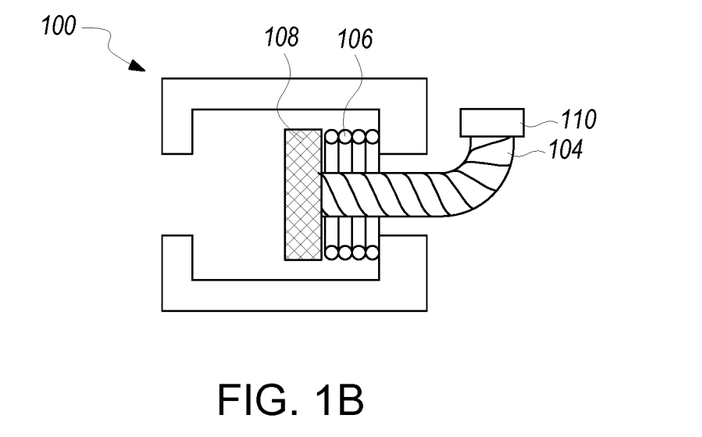

FIGS. 1A and 1B show an apparatus for connecting together electronic devices in accordance with some embodiments of the present disclosure to create a customized form factor. The apparatus can include an attachment mechanism 100 comprising a housing 102 in a device. In some embodiments, for example, the housing 102 can be part of an enclosure that houses an electronic device. In other embodiments, the housing 102 can be part of a detachable hinge module for connecting together electronic devices. These aspects of the present disclosure are illustrated below.

The attachment mechanism 100 includes a flexible cable 104 disposed in the housing 102. When in an extended position, the flexible cable 104 can extend though an opening 122 formed through the housing 102. Being flexible, the flexible cable 104 can bend in six degrees of freedom when in the extended position.

When in a retracted position, the flexible cable 104 can be configured so as to be retained fully within the housing 102. In accordance with some embodiments of the present disclosure, for example, the flexible cable 104 can be deemed to be within the housing when it is at most flush with the outer surface of the housing 102; in other words, when the surface of magnet 110 does not extend beyond the outer surface of housing 102.

In the retracted position, there is little likelihood of the flexible cable 104 catching on or otherwise interfering with another object that brushes against the outer surface of the housing 102.

In some embodiments, the attachment mechanism 100 can include a spring 106 and a spring flange 108. The spring flange 108 can be attached to one end of the flexible cable 104. The housing 102 can include a shoulder 124 formed at the opening 122 of the housing. When the flexible cable 104 is in the extended position, such as shown in FIG. 1B, the spring 106 is compressed between the spring flange 108 and the shoulder 124 of housing 102. The shortening of spring 106 creates a restoring force in the spring that tends to decompress (lengthen) the spring. This restoring force repositions the flexible cable 104 to the retracted position (FIG. 1A) fully within the housing 102.

In accordance with the present disclosure, the flexible cable 104 is magnetic. In some embodiments, for example, the flexible cable 104 can include a magnet 110 disposed at one end thereof. In other embodiments, the flexible cable 104 itself can be magnetized. Accordingly, the housing 102 can be any suitable material that is not magnetic in order not to interfere with the flexible cable 104. In some embodiments, for instance, housing 102 can be a plastic material.

Figure 1C:
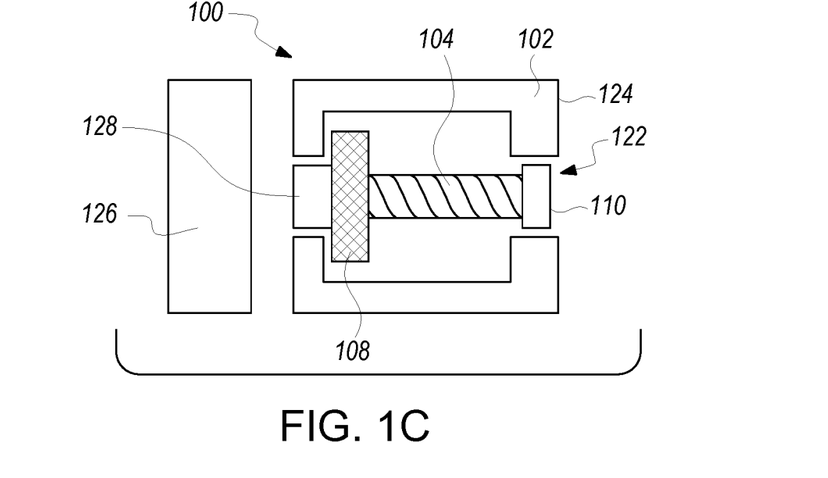

FIG. 1C shows an embodiment that uses a retractor mechanism other than spring 106 in FIG. 1A for retracting the flexible cable 104. In some embodiments, for example, the retractor mechanism 100 can be a solenoid 126 or other suitably configured electromagnetic device. The solenoid 126 can be turned on or otherwise activated to hold the flexible cable 104 in the retracted position, such as shown in FIG. 1C. A magnetic button 128 can be attached to the flange 108. When the solenoid 126 is turned on, the magnetic button 128 will be magnetically attracted to the solenoid thus retracting flexible cable 104 and holding the flexible cable in the retracted position within the housing 102.

Figure 2A:
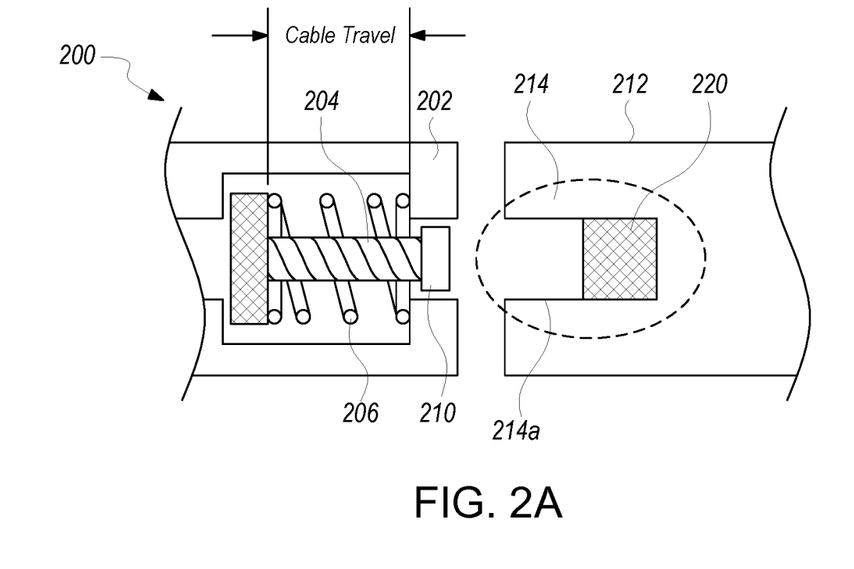
FIGS. 2A, 2B, 2C illustrate operation of an attachment mechanism in accordance with the present disclosure.
Figure 2B:
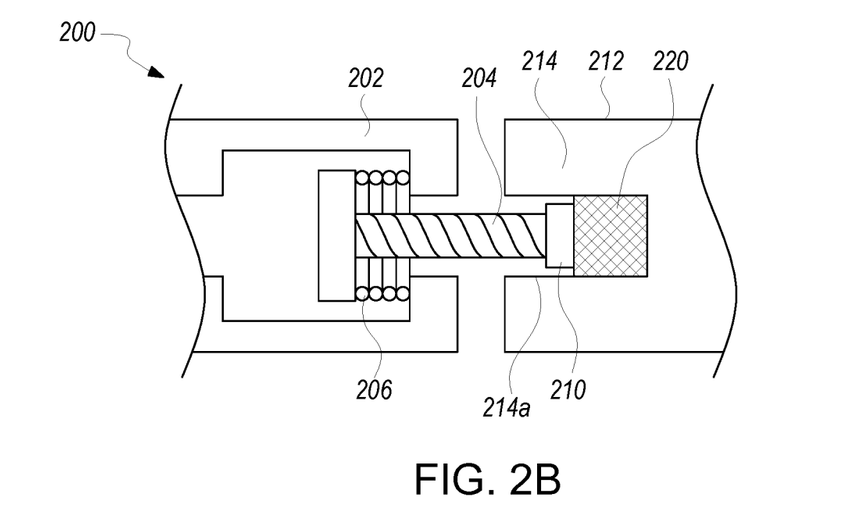

FIGS. 2A and 2B illustrate actuation of an attachment mechanism in accordance with the present disclosure. FIG. 2A shows an attachment mechanism 200 configured in the housing 202 of device A. The attachment mechanism 200 includes a flexible cable 204 and a magnet 210 disposed at an end of the flexible cable. The housing 202 can be any suitable material that is not magnetic in order not to interfere with the flexible cable 204. A device B includes a corresponding receptacle 214 disposed in the housing 212 of device B. The receptacle 214 can include a channel 214a formed in the housing 212 and an actuating magnet 220 fixedly disposed at the bottom of the channel. In some embodiments, for example, the magnet 220 can be glued to the channel 214a. The housing 212 can be any suitable material that is not magnetic so as not to interfere with magnet 220.

Actuation of the attachment mechanism 200 can be initiated when device A and device B are positioned proximate (near) each other and the attachment mechanism is aligned relative to the receptacle 214. The actuating magnet 220 in device B can attract the magnet 210 that is provided on flexible cable 204. The actuating magnet 220 being fixedly disposed in channel 214a will draw the flexible cable 204 from the fully retracted position within housing 202 of device A to the extended position to engage with receptacle 214, as depicted in FIG. 2B. In accordance with the present disclosure, the spring tension (e.g., spring constant) of the spring 206 can be designed to provide a restoring force that is less than the force of magnetic attraction between magnets 210 and 220. This balance of spring force and magnetic force allows flexible cable 204 to be actuated by magnet 220 when devices A and B are in proximity to each other and then retracted by spring 206 when device B is removed.

Figure 2C:
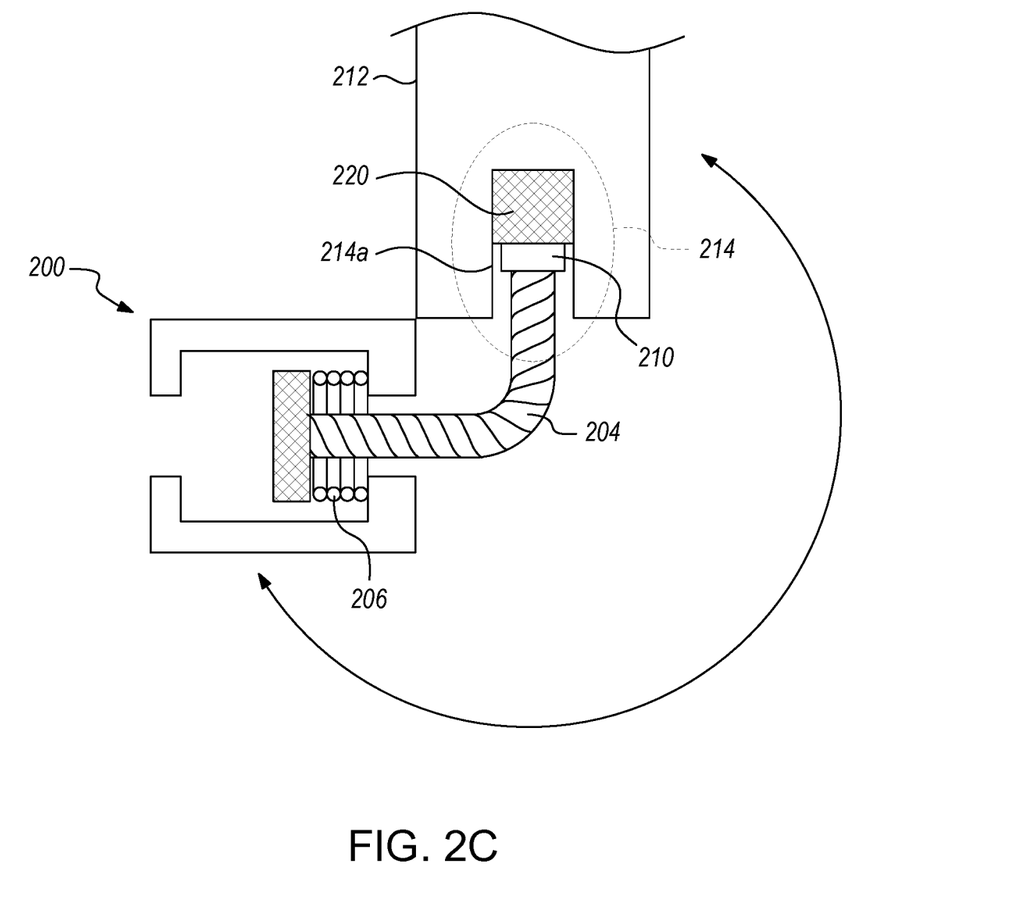

FIG. 2C illustrates a further aspect of the attachment mechanism 200 in accordance with the present disclosure when device A and device B are connected together. The bending degrees of freedom of flexible cable 204 allows for device A and device B to articulate over a range of angles yet remain connected together. FIG. 2C, for example, show the devices A and B rotated 90° from their initial 180° configuration shown in FIG. 2B. The cable travel distance of flexible cable 204 (see FIG. 2A) can be designed to allow for sufficient extension of the flexible cable as the articulation angle changes from the 180° "flat" position.

Figure 3:
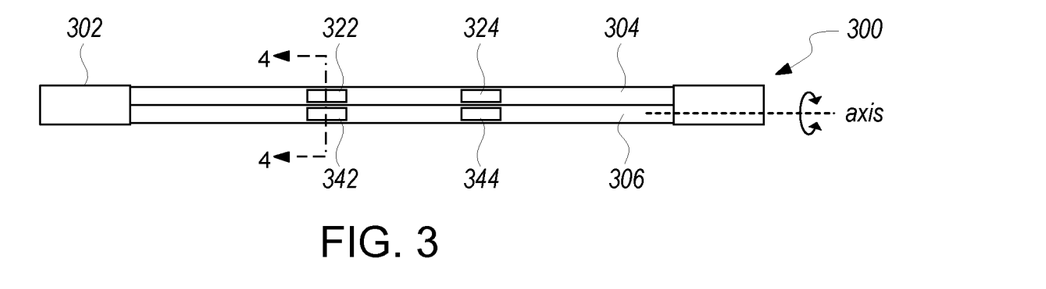
FIG. 3 shows a hinge module configured with an attachment mechanism in accordance with the present disclosure.

Referring to FIG. 3, in some embodiments, an attachment mechanism in accordance with the present disclosure can be incorporated in a detachable hinge module 300 for connecting together electronic devices. Referring for a moment to FIG. 5A, display panels 512, 514 can connected together using the hinge module of 300, and as shown in FIG. 5B, two or more hinge modules 300 can connected together multiple devices.

Returning to FIG. 3, the hinge module 300 can include a frame 302 that holds a brace 304 and an articulating knuckle 306 that can rotate about an axis. The brace 304 can be configured with one or more attachment mechanisms 322, 324 of the present disclosure, such as described above housed within the brace. Knuckle 306, likewise, can be configured with one or more attachment mechanisms 342, 344 of the present disclosure housed within the knuckle.

Figure 4A:
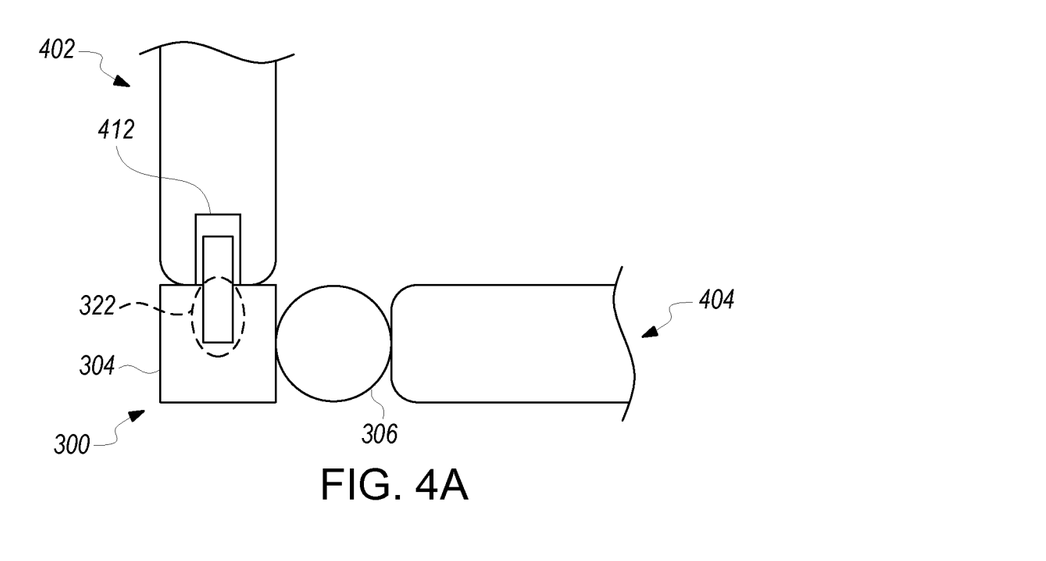
FIGS. 4A, 4B show operation of a hinge module in accordance with the present disclosure.
Figure 4B:
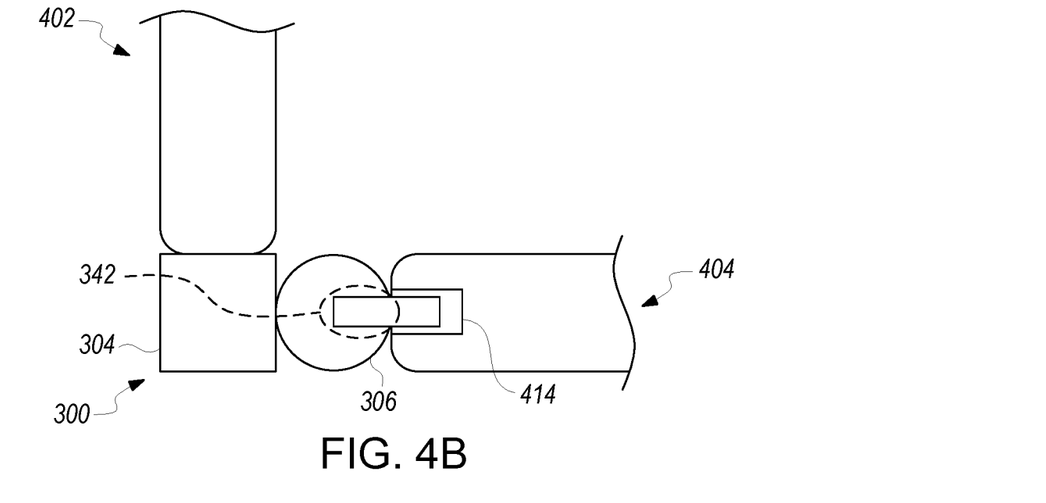

FIGS. 4A and 4B illustrate an example of hinge module 300 taken along view lines 4-4 in FIG. 3. FIGS. 4A and 4B show the hinge module 300 connecting together electronic device 402 and electronic device 404. The electronic devices 402, 402 can be any suitable devices, including but not limited to, computer tablets, electronic books (e-books), smart phones, keyboards, flat screen displays, writing tablets, and so on. FIG. 4A is a side view of the hinge module 300, showing details of device 402 connected to brace 304. The attachment mechanism 322 on brace 304 is aligned with a corresponding receptacle 412 formed in the housing of device 402 so that the flexible cable of the attachment mechanism 322 can engage with the corresponding receptacle 412. FIG. 4B, likewise, is a side view of the hinge module 300, showing details of device 404 connected to knuckle 306. The attachment mechanism 342 on knuckle 306 is aligned with a corresponding receptacle 414 formed in the housing of device 404 so that the flexible cable of the attachment mechanism 342 can engage with the corresponding receptacle 414. In some embodiments, the frame 302 and knuckle 306 can have cooperative friction surfaces to provide a friction fit between the body and knuckle, so that the relative articulation angle between devices 402, 404 can be maintained.

Figure 5:
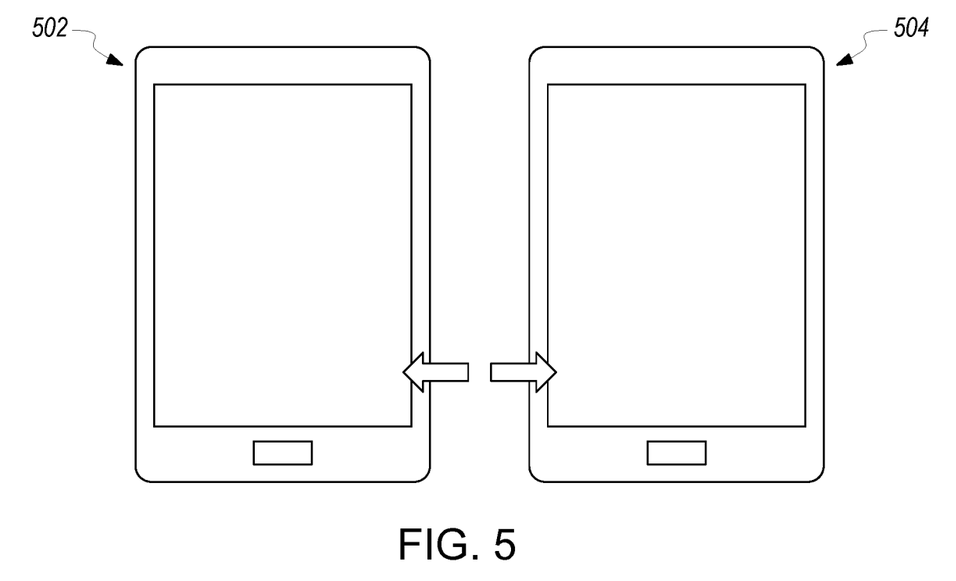
FIGS. 5, 5A, 5B, 5C illustrate electronic devices configured with an attachment mechanism in accordance with the present disclosure.
Figure 5A:
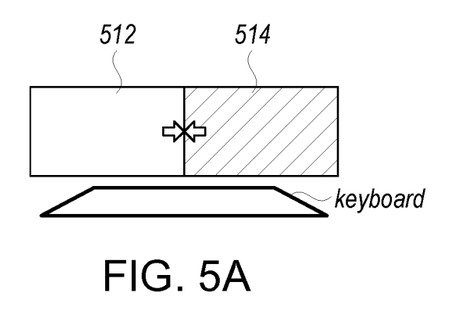
Figure 5B:
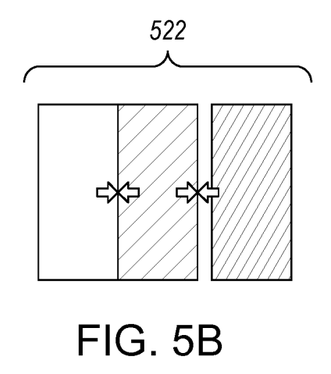
Figure 5C:
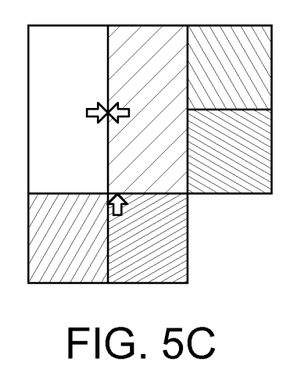

Referring to FIG. 5, in some embodiments, attachment mechanisms in accordance with the present disclosure can be incorporated in the housing component of the electronic devices. In FIG. 5, for instance, electronic device 502 can include an attachment mechanism (e.g., 200, FIG. 2A, 300, FIG. 3) that cooperates with a receptacle (e.g., 214, FIG. 2A) incorporated in the housing of electronic device 504 to connect together the two devices. FIG. 5A demonstrates a side-by-side configuration of electronic devices 512, 514 (e.g., display panels). FIG. 5B shows that several electronic devices 522 can be connected together in accordance with the present disclosure. FIG. 5C demonstrates that electronic devices of various sizes and shapes can be connected.

Figure 6:
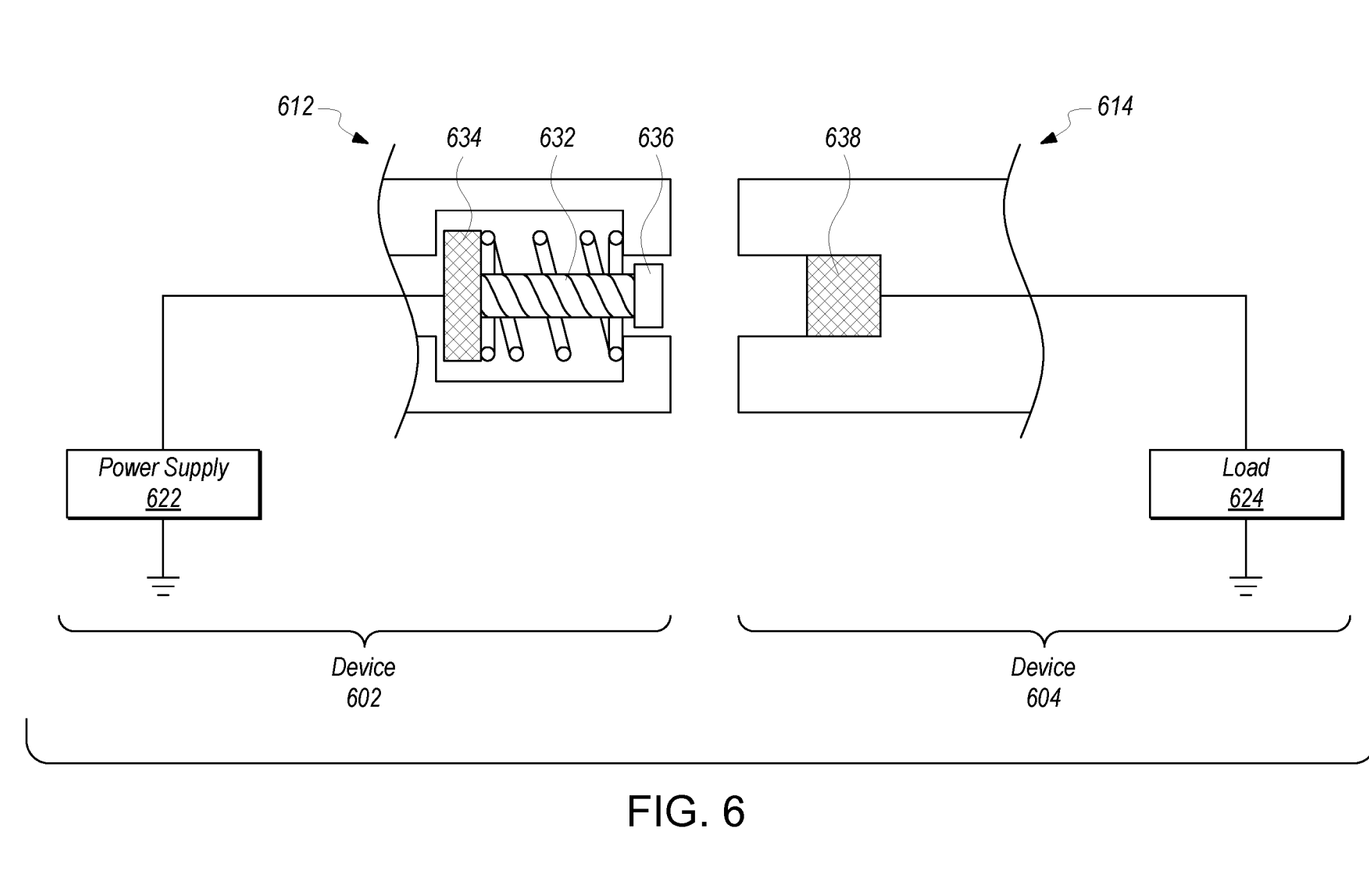
FIG. 6 illustrates an aspect of an attachment mechanism in accordance with the present disclosure.

Referring to FIG. 6, in accordance with some embodiments, electrical power can be transferred via an attachment mechanism of the present disclosure between connected electronic devices. In FIG. 6, for example, electronic device 602 includes an attachment mechanism 612 comprising a flexible cable 634, flange 634, and magnet 636 that are formed from electrically conductive material. A power supply 622 can be connected to the flange 634. Electronic device 604 can include a corresponding receptacle 614 comprising an actuation magnet 638 that is electrically connected to a load 624. When the flexible cable 632 engages the actuation magnet 638, an electrical circuit is created between the power supply 622 in device 602 and load 624 in device 604.

Figure 7:
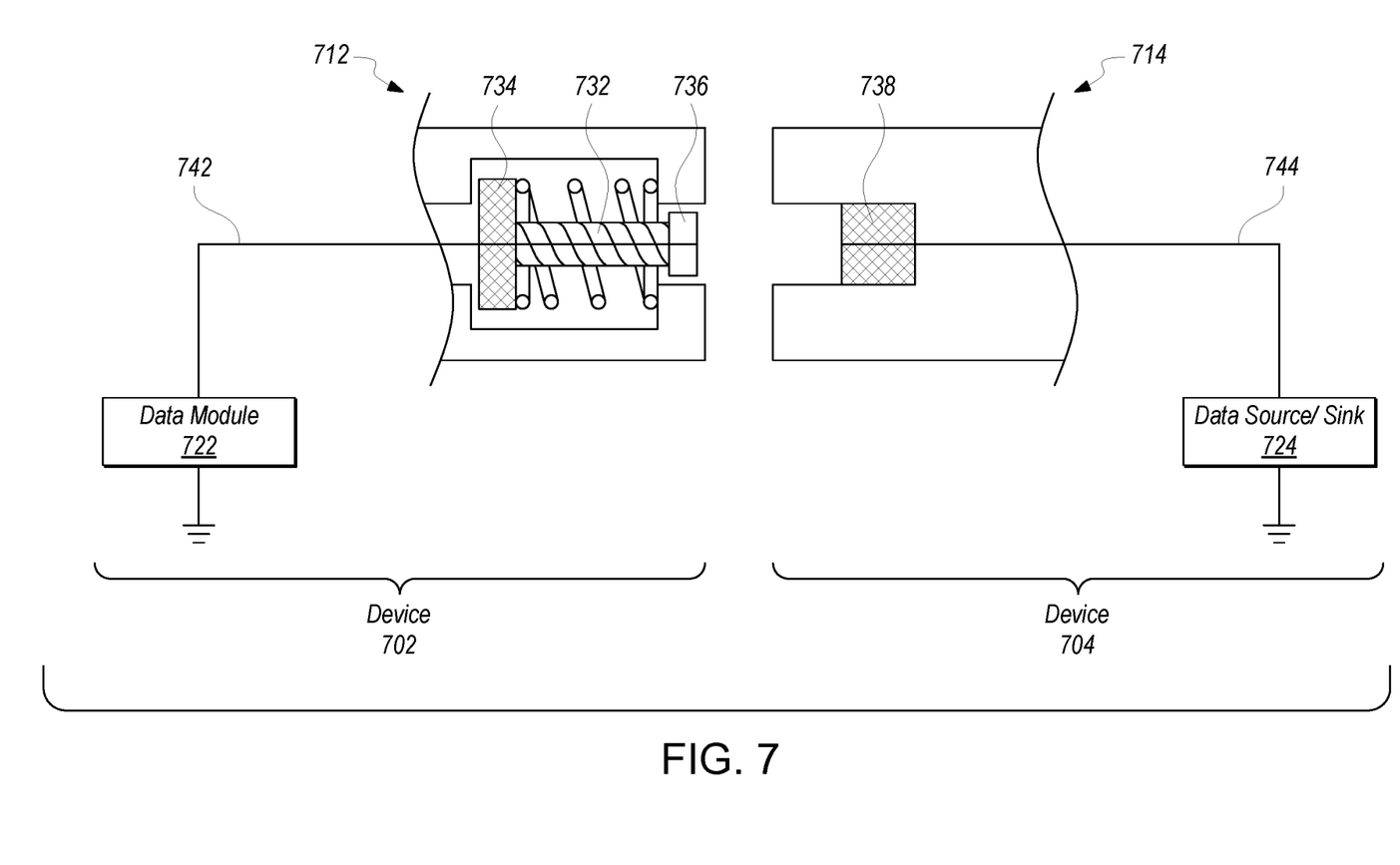
FIG. 7 illustrates an aspect of an attachment mechanism in accordance with the present disclosure.

In some embodiments, electronic devices connected via an attachment mechanism of the present disclosure can communicate with each other wirelessly; e.g., using Bluetooth® technology. Referring to FIG. 7, in accordance with some embodiments, data can be transferred via an attachment mechanism of the present disclosure between connected electronic devices. In FIG. 7, for example, electronic devices 702, 704 may include data sources and data sinks (data modules 722, 724); e.g., a process on one device may generate data that is consumed by a process on the other device. Device 702 can include an attachment mechanism 712 comprising a flexible cable 734, flange 734, and magnet 736. A fiber optic cable 742 can be disposed through their centers to provide an optical path for data module 722. Electronic device 704 can include a corresponding receptacle 714 comprising an actuation magnet 738 having disposed therethrough a fiber optic cable 744 to provide an optical path for data module 724. When the flexible cable 732 engages the actuation magnet 738, an optical path is created between the data module 722 in device 702 and data module 724 in device 704.

The discussion will turn to a description of an attachment mechanism in accordance with another aspect of the present disclosure. In some embodiments, the attachment mechanism can be adapted as a data connector, such as a universal serial bus (USB) Type C connector. It will be apparent that connectors other than USB can be adapted in accordance with the present disclosure. However, for explanation purposes only, the following embodiments will use a USB C connector as an illustrative example.

Figure 8:
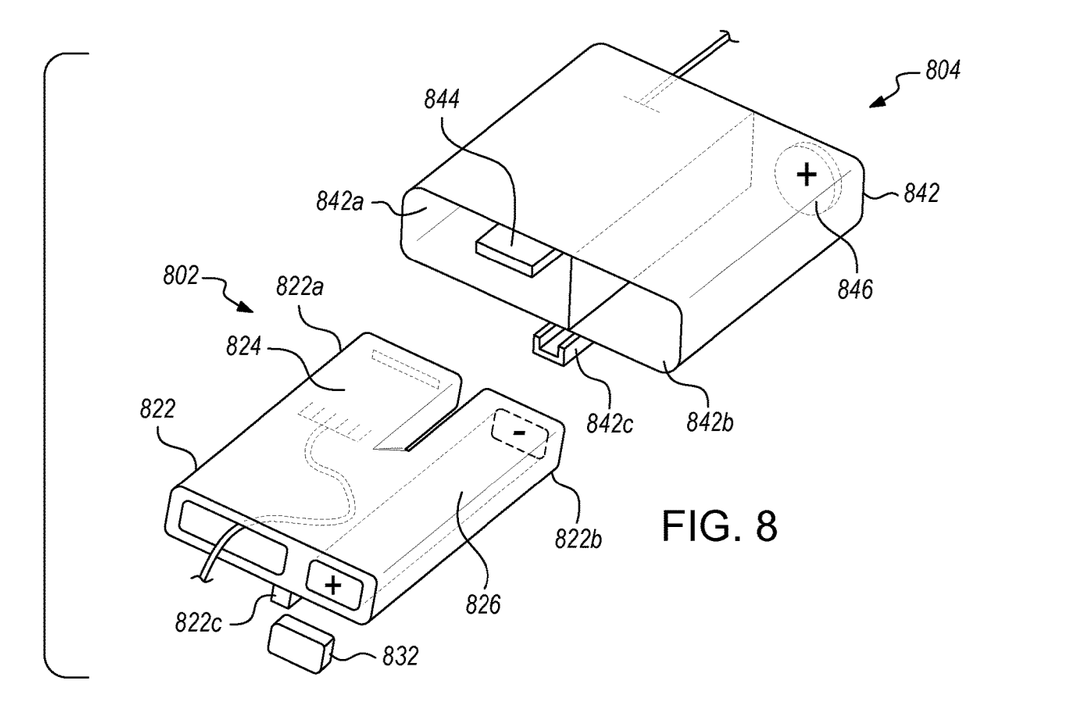
FIG. 8 illustrates a connector in accordance with the present disclosure.

Referring to FIG. 8, an attachment mechanism 802 in accordance with the present disclosure can be incorporated in a device (not shown), such as a computer tablet, mobile device, display panel, keyboard, and the like. The figure also shows a corresponding receptacle 804 in accordance with the present disclosure, that attachment mechanism 802 can connect to, can be incorporated in another device (not shown).

In some embodiments, attachment mechanism 802 can include a connector housing 822 comprising a compartment 822a that houses a data connector 824 (e.g., USB C). Housing 822 includes a second compartment 822b that houses an extender magnet 826. In some embodiments, housing 822 can include a rail tab 822c to facilitate alignment with receptacle 804.

The housing 822 can be configured with electrically conductive material to provide electromagnetic shielding for the data connector 824. In some embodiments, for example, the entire housing 822 can be a suitable electrically conductive material. In other embodiments, compartment 822a which houses the data connector 824 can include an interior lining of electrically conductive material.

A retraction magnet 832 can be mounted on a printed circuit board (not shown) of the device that incorporates the attachment mechanism 802. The retraction magnet 832 can be in alignment with the extender magnet 826 to restore the attachment mechanism 802 to the retracted position.

The corresponding receptacle 804 can include a receptacle housing 842 to receive the housing 822 of attachment mechanism 802. More specifically receptacle housing 842 can include compartments 842a and 842b to receive respective compartments 822a and 822b of housing 822. Compartment 842a can house a data connector 844. Compartment 842b can house an actuation magnet 846. Housing 842 can include a rail guide 842c to facilitate alignment with attachment mechanism 802.

The receptacle 804 can be configured with electrically conductive material to provide electromagnetic shielding for the data connector 844. In some embodiments, for example, the entire receptacle 804 can be a suitable electrically conductive material. In other embodiments, compartment 842a which houses the data connector 844 can include an interior lining of electrically conductive material.

In operation, when attachment mechanism 802 and receptacle 804 are in sufficiently close proximity, the actuating magnet 846 in the receptacle 804 can attract the extender magnet 826 and draw the compartments 822a, 822b of the attachment mechanism into the corresponding compartments 842a, 842b. Accordingly, the force of attraction between magnets 826 and 846 can overcome the force of attraction between magnets 826 and 832. The rail tab 822c can align with rail guide 842c to ensure a proper line of motion when attachment mechanism 802 engages receptacle 804.

Figure 9A:
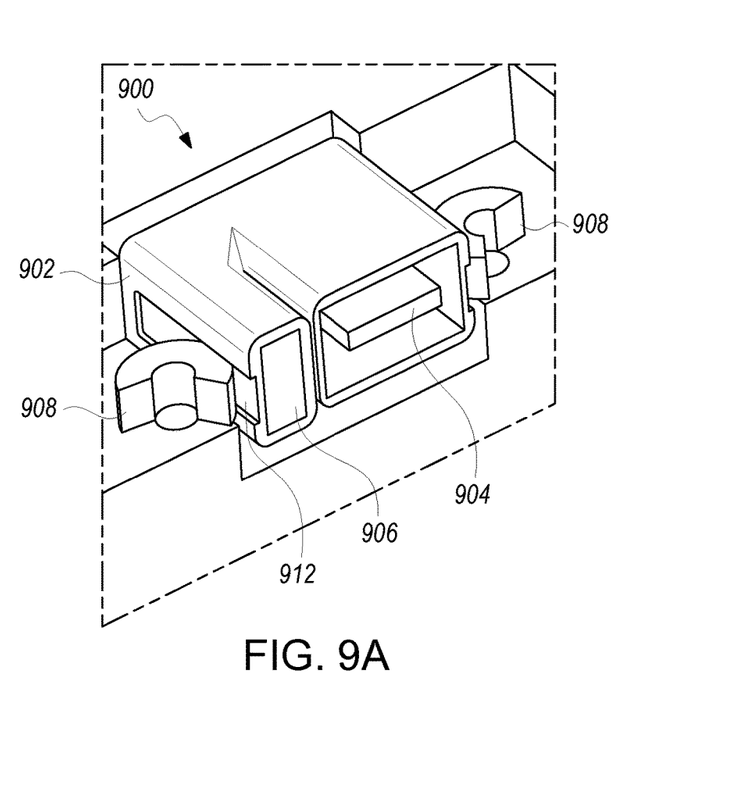
FIGS. 9A, 9B, 9C illustrates aspects of a connector in accordance with the present disclosure.
Figure 9B:
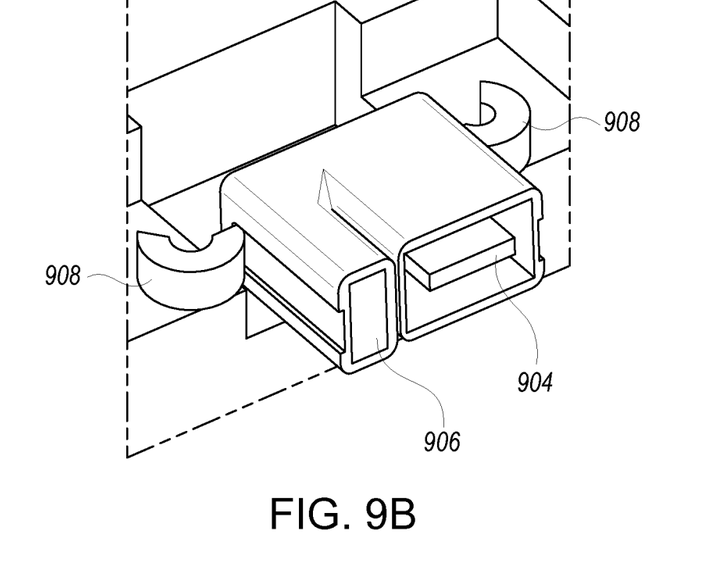
Figure 9C:
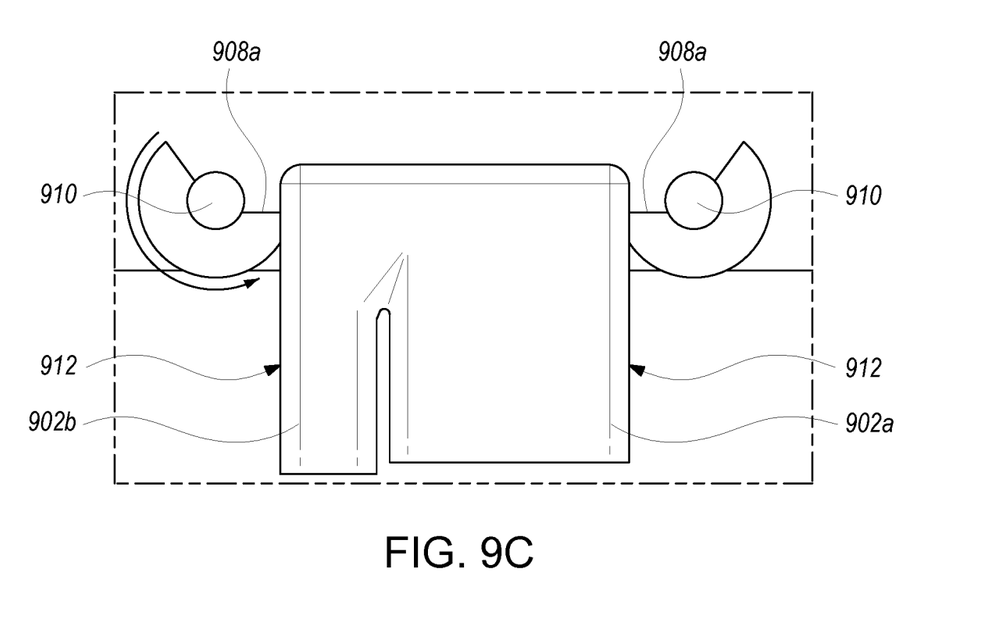

Referring to FIGS. 9A, 9B, and 9C, an attachment mechanism 900 in accordance with another embodiment can be incorporated in a device (not shown), such as a computer tablet, mobile device, display panel, keyboard, and the like. FIG. 9A shows the attachment mechanism 900 in the retracted position. FIG. 9B shows the attachment mechanism 900 in an extended position.

In some embodiments, attachment mechanism 900 can include a connector housing 902 comprising a compartment 902a that houses a data connector 904 (e.g., USB C) and another compartment 902b that houses a magnet 906. The housing 902 can be configured with electrically conductive material to provide electromagnetic shielding for the data connector 904. In some embodiments, for example, the entire housing 902 can be a suitable electrically conductive material. In other embodiments, compartment 902a which houses the data connector 904 can include an interior lining of electrically conductive material.

The attachment mechanism 900 can include friction rollers 908 to retract and maintain the attachment mechanism in the retracted position. In some embodiments, for example, the friction rollers 908 can frictionally engage channels formed on the housing 902 to serves as roller guides 912. The friction roller 908 can be mounted on roller pins 910 for rotation about the roller pins. Each friction roller 908 can be truncated to provide a C-shape that exposes two surfaces. As illustrated in FIG. 9C, one of the exposed surfaces on each of the friction rollers 908 serves as a stop 908a that engages the bottom of the channel on the housing 902 that comprises the roller guide 912. The stops 908a can limit the travel distance of the attachment mechanism 900 in the extended position.

The roller pins 910 can be spring-loaded to provide a torsional restoring force when the attachment mechanism 900 is in the extended position and the friction rollers are in tension. When the attachment mechanism 900 is released the torsional roller pins 910 can cleanly guide the attachment mechanism to the retracted position.

ADDITIONAL EMBODIMENTS

In accordance with the present disclosure an apparatus for connecting together devices includes at least one flexible magnetic cable disposed in a housing of a first device, the flexible magnetic cable having an extended position where the flexible magnetic cable protrudes through an opening formed through the housing, the flexible magnetic cable configured to engage with a corresponding receptacle on a second device when in the extended position. The flexible magnetic cable including a flanged end that limits an extension distance thereof when the flexible magnetic cable is in the extended position. A retractor is cooperative with the flexible magnetic cable to retain the flexible magnetic cable fully within the housing of the first device when the flexible magnetic cable is not engaged with the corresponding receptacle on the second device.

In some embodiments, the flexible magnetic cable includes a magnet affixed at a free end thereof.

In some embodiments, the retractor includes one of a spring and a solenoid.

In some embodiments, the flexible magnetic cable is attracted to an actuating magnet disposed in the corresponding receptacle in the second device.

In some embodiments, the flexible magnetic cable is disposed on a side of the housing.

In some embodiments, the flexible magnetic cable is configured to transfer power between the first and second devices when the flexible magnetic cable is engaged with the corresponding receptacle on the second device.

In some embodiments, the flexible magnetic cable is configured to transfer data between the first and second devices when the flexible magnetic cable is engaged with the corresponding receptacle on the second device.

In some embodiments, the first device is a hinge module.

In some embodiments, the first device is an electronic device.

In accordance with the present disclosure a device includes a housing and an attachment mechanism incorporated in the housing. The attachment mechanism comprises at least one flexible magnetic cable disposed in the housing of the device, the flexible magnetic cable having an extended position where the flexible magnetic cable protrudes through an opening formed through the housing, the flexible magnetic cable configured to engage with a corresponding receptacle on a second device when in the extended position. The flexible magnetic cable including a flanged end that limits an extension distance thereof when the flexible magnetic cable is in the extended position. A retractor is cooperative with the flexible magnetic cable to retain the flexible magnetic cable fully within the housing of the first device when the flexible magnetic cable is not engaged with the corresponding receptacle on the second device.

In some embodiments, the flexible magnetic cable includes a magnet affixed at a free end thereof.

In some embodiments, the retractor includes one of a spring and a solenoid.

In some embodiments, the flexible magnetic cable is attracted to an actuating magnet disposed in the corresponding receptacle in the second device.

In some embodiments, the flexible magnetic cable is disposed on a side of the housing.

In some embodiments, the flexible magnetic cable is configured to transfer power between the first and second devices when the flexible magnetic cable is engaged with the corresponding receptacle on the second device.

In some embodiments, the flexible magnetic cable is configured to transfer data between the first and second devices when the flexible magnetic cable is engaged with the corresponding receptacle on the second device.

In some embodiments, the first device is a hinge module.

In some embodiments, the first device is an electronic device.

In accordance with the present disclosure, a system can include a first device and a second device connected to the first device. The first device can have at least one attachment mechanism incorporated in a housing of the first device. The attachment mechanism can include at least one flexible magnetic cable disposed in the housing of the first device. The flexible magnetic cable can have an extended position where the flexible magnetic cable protrudes through an opening formed through the housing. The flexible magnetic cable can engage with a corresponding receptacle on the second device. The flexible magnetic cable can include a flanged end that limits an extension distance of the cable. A retractor cooperative with the flexible magnetic cable can retain the flexible magnetic cable fully within the housing of the first device when the flexible magnetic cable is not engaged with the corresponding receptacle on the second device.

In some embodiments, the flexible magnetic cable is attracted to an actuating magnet disposed in the corresponding receptacle in the second device.

The above description illustrates various embodiments of the present disclosure along with examples of how aspects of the particular embodiments may be implemented. The above examples should not be deemed to be the only embodiments and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. An apparatus for connecting together devices, the apparatus comprising:
   at least one flexible magnetic cable disposed in a housing of a first device, the flexible magnetic cable having an extended position where the flexible magnetic cable protrudes through an opening formed through the housing, the flexible magnetic cable configured to engage with a corresponding receptacle on a second device when in the extended position;
   the flexible magnetic cable including a magnet affixed at a free end thereof, and a flange affixed at a flanged end disposed inside the housing that limits an extension distance thereof when the flexible magnetic cable is in the extended position, the free end and the flanged end being opposite ends of the flexible magnetic cable; and
   a retractor disposed at least in part inside the housing and cooperative with the flexible magnetic cable to retain the flexible magnetic cable fully within the housing of the first device when the flexible magnetic cable is not engaged with the corresponding receptacle on the second device.

2. The apparatus of claim 1, wherein the retractor includes a spring disposed inside the housing, attached to the flange at one end, and to an interior surface of a shoulder that defines the opening at an opposite end; the spring being compressed when the flexible magnetic cable is in the extended position to provide a restoring force to restore the flexible magnetic cable to a retracted position.

3. The apparatus of claim 1, wherein the magnet is a first magnet, and the apparatus further includes a second magnet affixed to the flange, and a solenoid configured to attract the second magnet, when the solenoid is turned on, to hold the flexible magnetic cable in a retracted position.

4. The apparatus of claim 1, wherein the flexible magnetic cable is attracted to an actuating magnet disposed in an interior space in the corresponding receptacle in the second device.

5. The apparatus of claim 1, the flexible magnetic cable being configured to transfer power between the first and second devices when the flexible magnetic cable is engaged with the corresponding receptacle on the second device.

6. The apparatus of claim 1, the flexible magnetic cable being configured to transfer data between the first and second devices when the flexible magnetic cable is engaged with the corresponding receptacle on the second device.

7. The apparatus of claim 1, wherein the first device is a hinge module.

8. The apparatus of claim 1, wherein the first device is an electronic device.

9. A device comprising:
   a housing;
   an attachment mechanism incorporated in the housing, the attachment mechanism comprising:
      at least one flexible magnetic cable disposed in the housing of the device, the flexible magnetic cable having an extended position where the flexible magnetic cable protrudes through an opening formed through the housing, the flexible magnetic cable configured to engage with a corresponding receptacle on a second device when in the extended position;
      the flexible magnetic cable including a magnet affixed at a free end thereof, and a flange affixed at a flanged end disposed inside the housing that limits an extension distance thereof when the flexible magnetic cable is in the extended position, the free end and the flanged end being opposite ends of the flexible magnetic cable; and
      a retractor disposed at least in part inside the housing and cooperative with the flexible magnetic cable to retain the flexible magnetic cable fully within the housing of the first device when the flexible magnetic cable is not engaged with the corresponding receptacle on the second device.

10. The device of claim 9, wherein the retractor includes a spring disposed inside the housing, attached to the flange at one end, and to an interior surface of a shoulder that defines the opening at an opposite end; the spring being compressed when the flexible magnetic cable is in the extended position to provide a restoring force to restore the flexible magnetic cable to a retracted position.

11. The device of claim 9, wherein the magnet is a first magnet, and the apparatus includes a second magnet affixed to the flange, and a solenoid, configured to attract the second magnet, when the solenoid is turned on, to hold the flexible magnetic cable in the retracted position.

12. The device of claim 9, wherein the flexible magnetic cable is attracted to an actuating magnet disposed in an interior space in the corresponding receptacle in the second device.

13. The device of claim 9, the flexible magnetic cable being configured to transfer power between the first and second devices when the flexible magnetic cable is engaged with the corresponding receptacle on the second device.

14. The device of claim 9, the flexible magnetic cable being configured to transfer data between the first and second devices when the flexible magnetic cable is engaged with the corresponding receptacle on the second device.

15. The device of claim 9, wherein the first device is a hinge module.

16. The device of claim 9, wherein the first device is an electronic device.

17. A system comprising:
a first device; and
a second device connected to the first device,
the first device having at least one attachment mechanism incorporated in a housing of the first device, the attachment mechanism comprising:
at least one flexible magnetic cable disposed in the housing of the first device, the flexible magnetic cable having an extended position where the flexible magnetic cable protrudes through an opening formed through the housing, the flexible magnetic cable engaged with a corresponding receptacle on the second device;
the flexible magnetic cable including a magnet affixed at a free end thereof, and a flange affixed at a flanged end disposed inside the housing that limits an extension distance thereof, the free end and the flanged end being opposite ends of the flexible magnetic cable; and
a retractor disposed at least in part inside the housing and cooperative with the flexible magnetic cable to retain the flexible magnetic cable fully within the housing of the first device when the flexible magnetic cable is not engaged with the corresponding receptacle on the second device.

18. The system of claim 17, wherein the flexible magnetic cable is attracted to an actuating magnet disposed in an interior space in the corresponding receptacle in the second device.

* * * * *